United States Patent [19]
Kitaoka

[11] Patent Number: 5,757,075
[45] Date of Patent: May 26, 1998

[54] SEMICONDUCTOR HEAT SINK APPARATUS

[75] Inventor: Kouki Kitaoka, Sakurai, Japan

[73] Assignee: Sharp Kabushiki Kaisha, Osaka, Japan

[21] Appl. No.: 630,582

[22] Filed: Apr. 11, 1996

[30] Foreign Application Priority Data

Apr. 26, 1995 [JP] Japan ................... 7-102236

[51] Int. Cl.⁶ .................... H01L 23/34; H01L 23/495
[52] U.S. Cl. ................ 257/712; 257/675; 257/706;
257/720; 257/796; 361/709; 361/714; 361/717
[58] Field of Search ................... 257/675, 712,
257/713, 720, 796, 706; 361/707, 709,
714, 717, 718

[56] References Cited

U.S. PATENT DOCUMENTS

| | | | |
|---|---|---|---|
| 5,227,662 | 7/1993 | Ohno et al. | 257/676 |
| 5,367,193 | 11/1994 | Malladi | 257/707 |
| 5,444,296 | 8/1995 | Karl et al. | 257/686 |
| 5,455,457 | 10/1995 | Kurokawa | 257/712 |
| 5,477,081 | 12/1995 | Nagayoshi | 257/712 |
| 5,489,801 | 2/1996 | Blish, II | 257/675 |
| 5,594,282 | 1/1997 | Otsuki | 257/796 |

FOREIGN PATENT DOCUMENTS

| | | | |
|---|---|---|---|
| 54-128278 | 10/1979 | Japan | 257/796 |
| 3-104142 | 5/1991 | Japan | 257/796 |
| 4-79256 | 3/1992 | Japan | |
| 4-312963 | 11/1992 | Japan | |

*Primary Examiner*—Tom Thomas
*Assistant Examiner*—David Ostrowski
*Attorney, Agent, or Firm*—Nixon & Vanderhye PC

[57] ABSTRACT

A semiconductor apparatus includes a semiconductor chip having an upper surface, a lower surface and at least one side surface; a first radiator plate for radiating heat including a plate portion having an upper surface, a lower surface and at least one side surface and a body portion having an upper surface, a lower surface and at least one side surface. The upper surface of the body portion has an area smaller than an area of the lower surface of the plate portion and is connected with the lower surface of the plate portion. The semiconductor apparatus also includes a second radiator plate for radiating heat including an upper surface, a lower surface and at least one side surface. The upper surface of the second radiator plate has an area larger than the lower surface of the body portion of the first radiator plate. The apparatus still further includes a case body surrounding the lower surface and the side surface of the semiconductor chip and a cover which is located above the upper surface of the semiconductor chip and is connected with the case body. This structure provides a semiconductor apparatus incorporating a semiconductor device mounted in a hollow plastic package having a radiator system, without deteriorating the mechanical strength and the moisture resistance of the package.

20 Claims, 9 Drawing Sheets

SEMICONDUCTOR HEAT SINK APPARATUS

BACKGROUND OF THE INVENTION

1. Field of the Invention

The present invention relates to a semiconductor apparatus in which a semiconductor device is mounted in a hollow plastic package having a radiator system.

2. Description of the Related Art

A ceramic dual in-line package in which a lead frame is sandwiched between a window frame and a base frame, both of which are made of a ceramic material, via glass having a low melting point, has conventionally been used as a package for a semiconductor device, especially for a solid-state imaging device. However, in recent years, a hollow plastic package has been used more frequently for the purpose of fabricating a light-weight package with high precision and at a lower cost.

Figure 6:
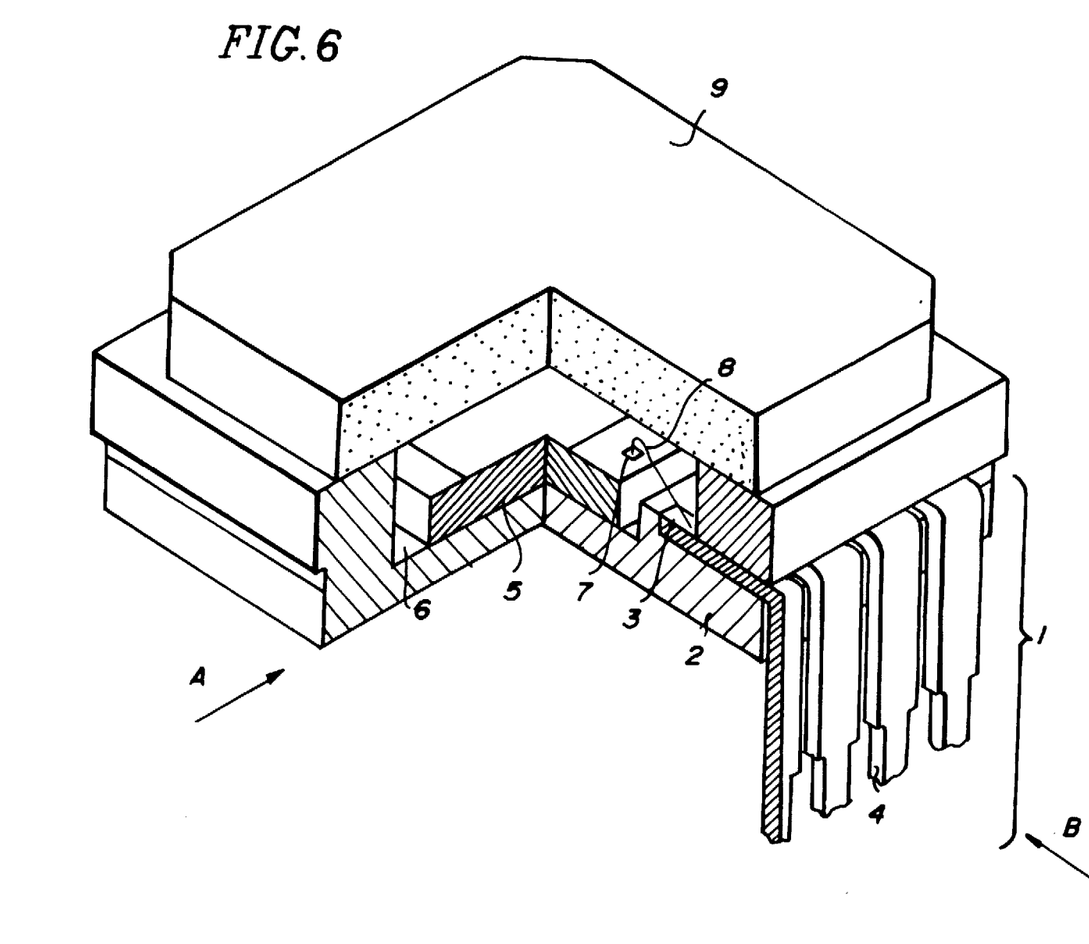
FIG. 6 is a partially cutaway perspective view of a conventional semiconductor apparatus.
Figure 7A:
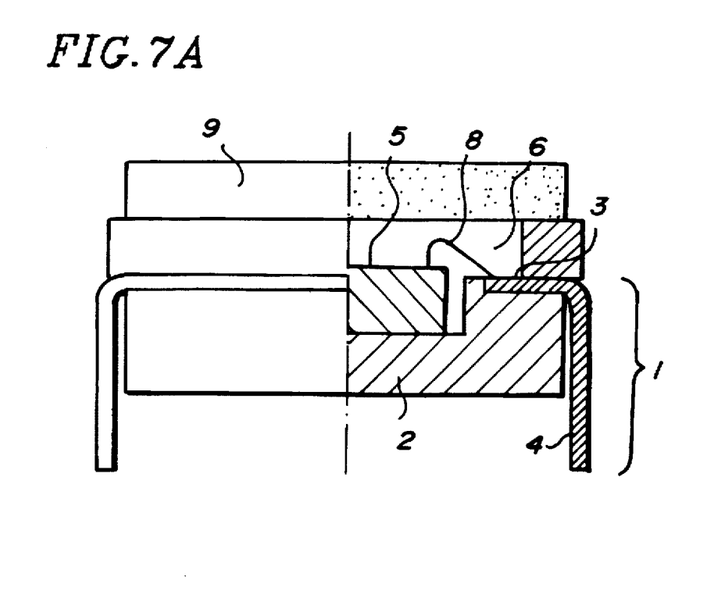
Figure 7B:
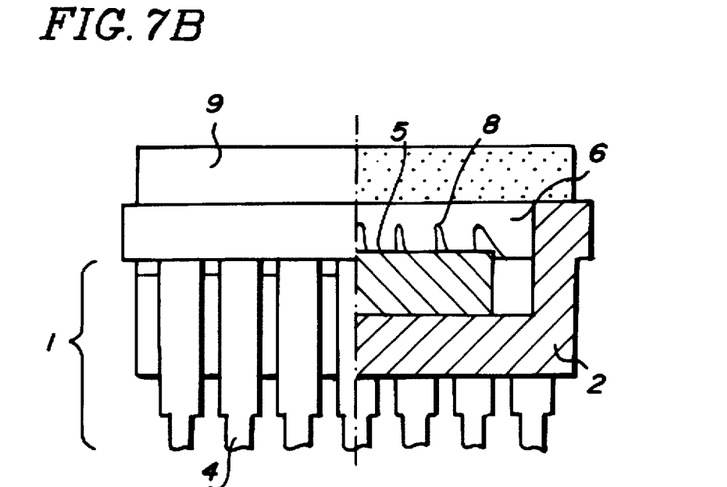
FIG. 7B is a sectional side elevation, seen from the direction B, of the semiconductor apparatus shown in FIG. 6.

A conventional hollow plastic package will be described with reference to FIGS. 6, 7A and 7B. FIG. 6 is a partially cutaway perspective view of a conventional semiconductor apparatus; FIG. 7A is a sectional side elevation, seen from the direction A, of the semiconductor apparatus shown in FIG. 6; and FIG. 7B is a sectional side elevation, seen from the direction B, of the semiconductor apparatus shown in FIG. 6.

In a conventional semiconductor apparatus, in order to secure a hollow portion 6 for mounting a semiconductor device therein after the molding is finished, a lead frame 1 made of a metal material such as 42 alloy or the like, which is formed by etching, pressing or the like, so as to have a predetermined pattern, is sandwiched between processed molds for molding.

A package is partially molded by transfer molding a moldable resin 2 such as a thermosetting epoxy resin, into the mold. An inner lead 3 and an outer lead 4 can be plated with gold beforehand. The outer lead 4 is bent into a predetermined shape.

A semiconductor device 5 is directly die-bonded to a silver paste or the like on the inner bottom of the hollow portion 6 of the hollow plastic package made of the moldable resin 2.

An aluminum electrode 7 located on the upper surface of the semiconductor device 5 is wire-bonded to the inner lead 3 via a fine aluminum wire or a fine gold wire 8, thereby establishing an electrical connection between the aluminum electrode 7 and the inner lead 3. Thereafter, the opening of the hollow plastic package is covered with a lid 9. The lid 9 is bonded to the hollow plastic package via an adhesive made of a thermosetting epoxy resin or the like.

In a semiconductor apparatus described in Japanese Laid-Open Patent Publication No. 4-79256, a metal plate is placed on the inner bottom of the hollow plastic package on which a semiconductor device is to be mounted.

The metal plate radiates the heat generated by the semiconductor device during the operation thereof.

On the other hand, in a semiconductor apparatus described in Japanese Laid-Open Patent Publication No. 4-395393, an island portion constituting a part of a lead frame functions as a metal plate having a radiation effect.

These semiconductor apparatuses, however, have the following problems.

During the operation of a semiconductor device, almost all the heat generated by the semiconductor device is radiated into the air through the reverse side of a package and a base frame. In a ceramic dual in-line package which has conventionally been widely used, the thermal conductivity of a ceramic material for the package is about $40 \times 10^{-4}$ cal/(mm·sec·°C.).

Accordingly, in the case where a solid-state imaging device, for example, is mounted in a ceramic dual in-line package as a semiconductor device, the probability of a white point defect appearing in imaging when it is dark (hereinafter, referred to as a "white point in darkness"), is negligible.

However, as described above, since hollow plastic packaging has been replacing ceramic dual in-line packaging as packaging for a solid-state imaging device, the probability of appearance of the white point in darkness has reached a considerable level.

The thermal conductivity of a moldable resin used as a package material for the hollow plastic package is about $2 \times 10^{-4}$ cal/(mm·sec·°C.), i.e., about one-twentieth of that of the ceramic material. In other words, the heat generated by the semiconductor device during the operation thereof cannot be sufficiently radiated into the air from such a hollow plastic package. As a result, the temperature of the solid-state imaging device itself disadvantageously increases and the possibility of appearance of the white point in darkness becomes adversely high.

The semiconductor apparatuses described in Japanese Laid-Open Patent Publication Nos. 4-79256 and 4-312963 are provided with a moisture resistant plate. Furthermore, a resin portion exists between the semiconductor device and the moisture resistant plate, so that the heat is accumulated in the resin portion. Therefore, it is impossible to attain a satisfactory radiation effect in these semiconductor apparatuses.

It is possible to radiate the accumulated heat by connecting a semiconductor device with a moisture resistant plate located at a position remote from the semiconductor device via a metal for attaining a radiation effect. However, it is difficult to precisely form a resin at a predetermined position between a semiconductor device and a moisture resistant plate.

Figure 8:
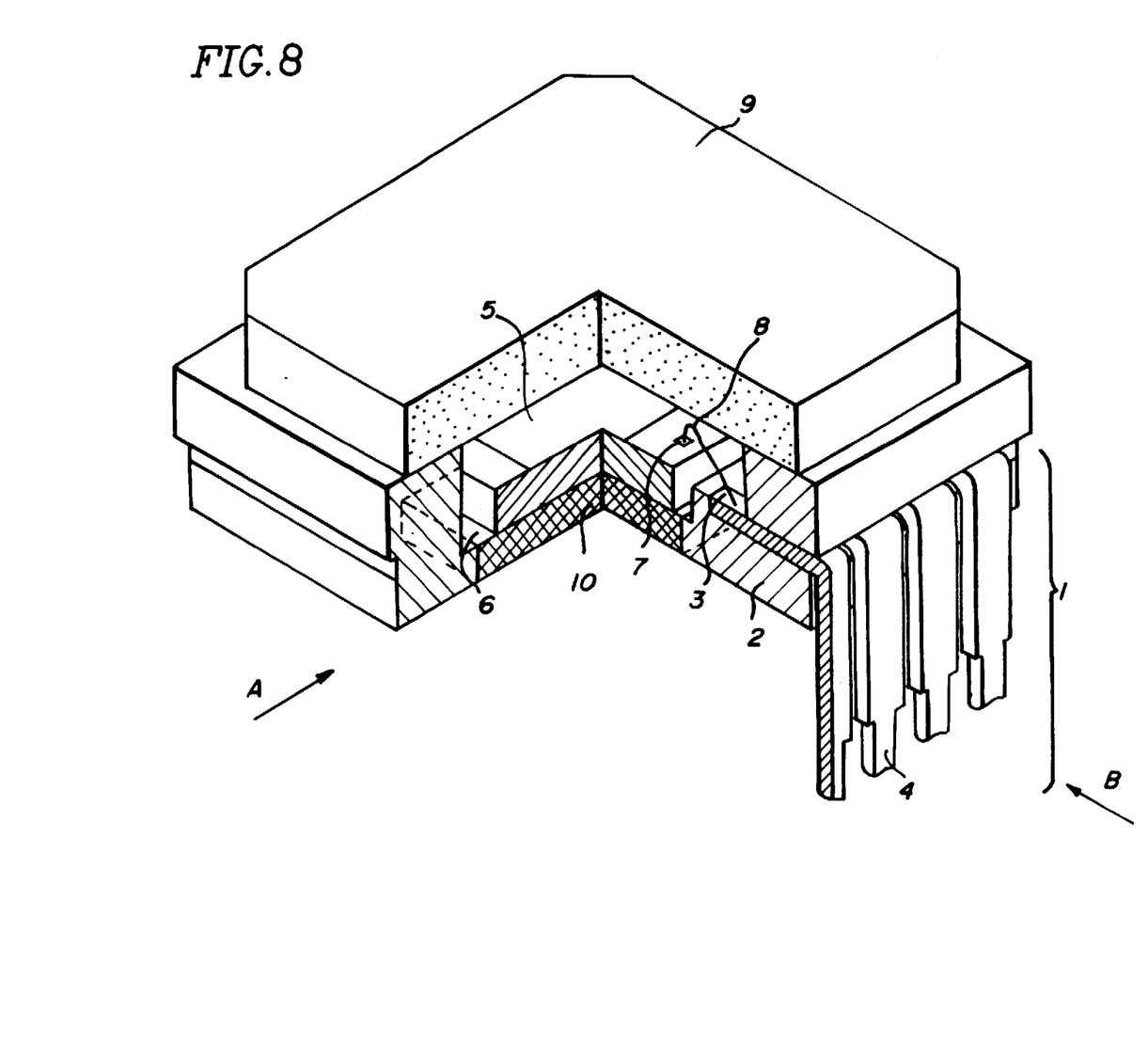
FIG. 8 is a partially cutaway perspective view of another conventional semiconductor apparatus.
Figure 9A:
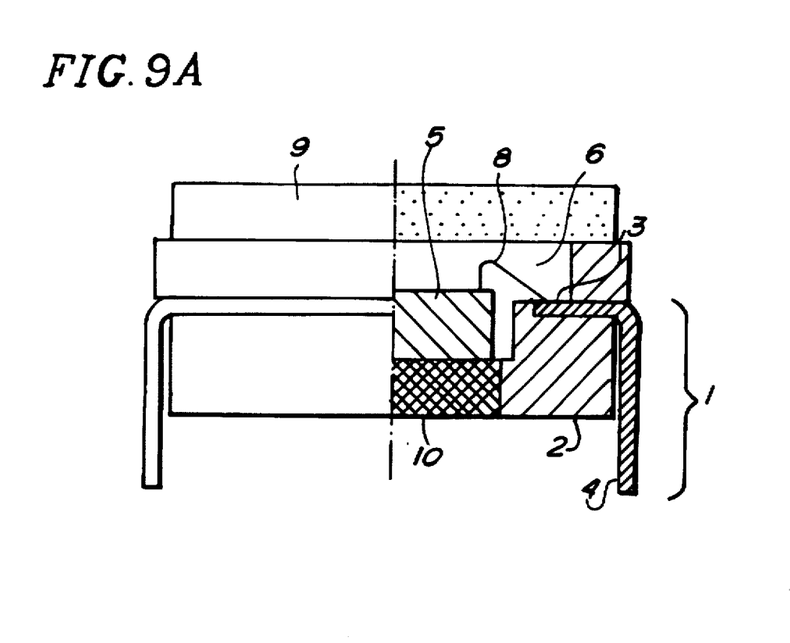
Figure 9B:
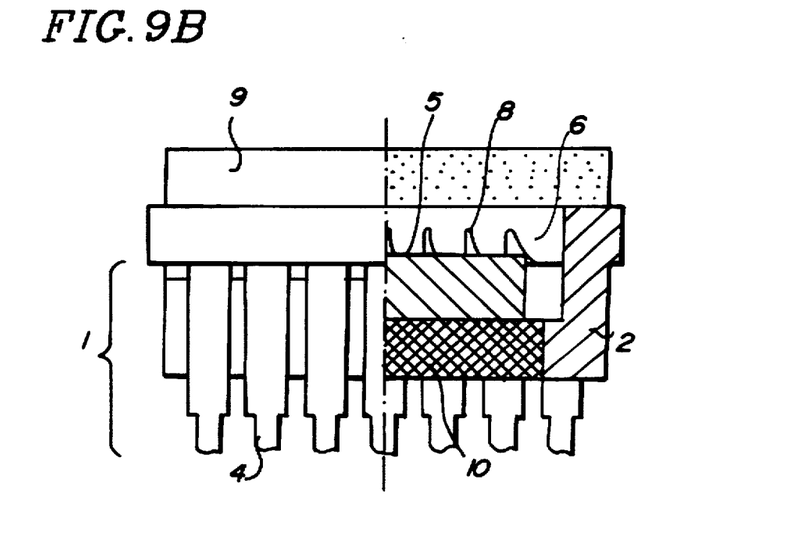
FIG. 9B is a sectional side elevation, seen from the direction B, of the semiconductor apparatus shown in FIG. 8.

A package having a structure shown in FIGS. 8, 9A and 9B, in which a radiator plate 10 made of a metallic material is embedded under the bottom of the hollow portion 6, can also be used by utilizing technologies for fabricating a plastic package having no hollow portion.

Such a structure has a radiation ability substantially equal to that of the ceramic dual in-line package.

However, since the radiator plate 10 having a thickness of about 1 mm is retained in the package only by adhering the side surface of the radiator plate 10 to the package with a moldable resin, the mechanical strength of the package becomes extremely poor.

In addition, since the moisture is likely to externally permeate the adhesion interface into the package, the moisture resistance of the package also becomes adversely low.

SUMMARY OF THE INVENTION

The semiconductor apparatus of the invention includes: a semiconductor chip having an upper surface, a lower surface and at least one side surface; a first radiator plate for radiating heat including a plate portion having an upper surface, a lower surface and at least one side surface and a body portion having an upper surface, a lower surface and at least one side surface, the upper surface of the body portion having an area smaller than an area of the lower surface of the plate portion and being connected with the lower surface of the plate portion; a second radiator plate for radiating heat including an upper surface, a lower surface and at least one side surface, the upper surface of the second radiator plate having an area larger than the lower surface of the body portion of the first radiator plate; a case body surrounding the lower surface and the sides surface of the semiconductor chip; and a cover which is located above the upper surface of the semiconductor chip and is connected with the case body. In the semiconductor apparatus, the lower surface of the semiconductor chip is connected with the upper surface of the plate portion of the first radiator plate; the lower surface of the body portion of the first radiator plate is connected with the upper surface of the second radiator plate so as to define a space between the lower surface of the plate portion of the first radiator plate and the upper surface of the second radiator plate; and a part of the case body is located between the lower surface of the plate portion of the first radiator plate and the upper surface of the second radiator plate so as to fill the space defined between the lower surface of the plate portion of the first radiator plate and the upper surface of the second radiator plate.

In one embodiment, the case body further surrounds the second radiator plate.

In another embodiment, the area of the lower surface of the semiconductor chip is larger than that of the upper surface of the plate portion of the first radiator plate, and the area of the upper surface of the plate portion of the first radiator plate is larger than that of the lower surface of the body portion of the first radiator plate.

In still another embodiment, the upper surface of the plate portion of the first radiator plate is substantially parallel to the lower surface of the body portion of the first radiator plate.

In still another embodiment, the upper surface of the plate portion of the first radiator plate is substantially parallel to the lower surface of the second radiator plate.

In still another embodiment, the semiconductor chip is not in contact with the case body.

In still another embodiment, the semiconductor chip is a solid-state imaging device in still another embodiment, the cover is a transparent member.

In still another embodiment, the case body is made of a resin.

In still another embodiment, the semiconductor apparatus further includes a plurality of terminals, each of which is formed of a lead frame, and the second radiator plate is an island formed of the lead frame.

In the semiconductor apparatus according to the present invention, a moldable resin is also filled between a radiator member and an island. Accordingly, the adhesion area between the moldable resin and the radiator member or between the moldable resin and the island becomes far larger than the adhesion area between the moldable resin and the radiator plate shown in FIGS. 8, 9A and 9B. Therefore, the package for the semiconductor apparatus according to the present invention has a mechanical strength sufficiently higher than that of a conventional package for a semiconductor apparatus.

In addition, the total length of the adhesion interface between the moldable resin and the radiator member and/or the total length of the adhesion interface between the moldable resin and the island which ranges from the reverse side of the package to the hollow portion becomes far larger than that of the adhesion interface between the moldable resin and the radiator plate shown in FIGS. 8, 9A and 9B. In the semiconductor apparatus according to the present invention, the time required for the moisture externally permeating the package to reach the hollow portion becomes longer as compared with a conventional semiconductor apparatus. As a result, the moisture resistance thereof can also be improved.

Moreover, the heat generated by the semiconductor device during the operation thereof can be effectively radiated into the air without deteriorating the mechanical strength and the moisture resistance of the package. Therefore, in the case where the semiconductor device of the invention is a solid-state imaging device, the semiconductor apparatus of the present invention can reduce the probability of appearance of the white point in darkness to that of a ceramic dual in-line package product or less.

Furthermore, since a part of the bottom surface of the semiconductor device is retained on the upper surface of the radiator member, the upper surface having an area smaller than that of the bottom surface of the semiconductor device, depending upon the precision of the process for placing the semiconductor device, the semiconductor device is less likely to be affected by the unevenness of the upper surface of the radiator member, as compared with the case where the semiconductor device is placed on the upper bottom of the hollow portion of the package and the bottom of the semiconductor device is entirely in contact with the upper bottom of the hollow portion. Therefore, the gate of a solid-state imaging device can also be defined with high precision, though the precision of the gate ordinarily becomes low when a lens or the like is attached to the solid-state imaging device.

Thus, the invention described herein makes possible the advantage of providing a semiconductor apparatus in which a semiconductor device is mounted in a hollow plastic package having a radiator system, without deteriorating the mechanical strength and the moisture resistance of the package.

This and other advantages of the present invention will become apparent to those skilled in the art upon reading and understanding the following detailed description with reference to the accompanying figures.

BRIEF DESCRIPTION OF THE DRAWINGS

FIG. 2A is a sectional side elevation, seen from the direction A, of the semiconductor apparatus shown in FIG. 1, while

FIG. 3A is a partially cutaway perspective view of the semiconductor apparatus in which a semiconductor device of the first example is mounted on a hollow package having a radiator member; while

FIG. 5A is a sectional side elevation, seen from the direction A, of the semiconductor apparatus shown in FIG. 4, while

FIG. 7A is a sectional side elevation, seen from the direction A, of the semiconductor apparatus shown in FIG. 6, while

FIG. 9A is a sectional side elevation, seen from the direction A, of the semiconductor apparatus shown in FIG. 8, while

DESCRIPTION OF THE PREFERRED EMBODIMENTS

Hereinafter, the semiconductor apparatus according to the present invention will be described by way of illustrative examples with reference to the accompanying drawings.

EXAMPLE 1

Figure 1:
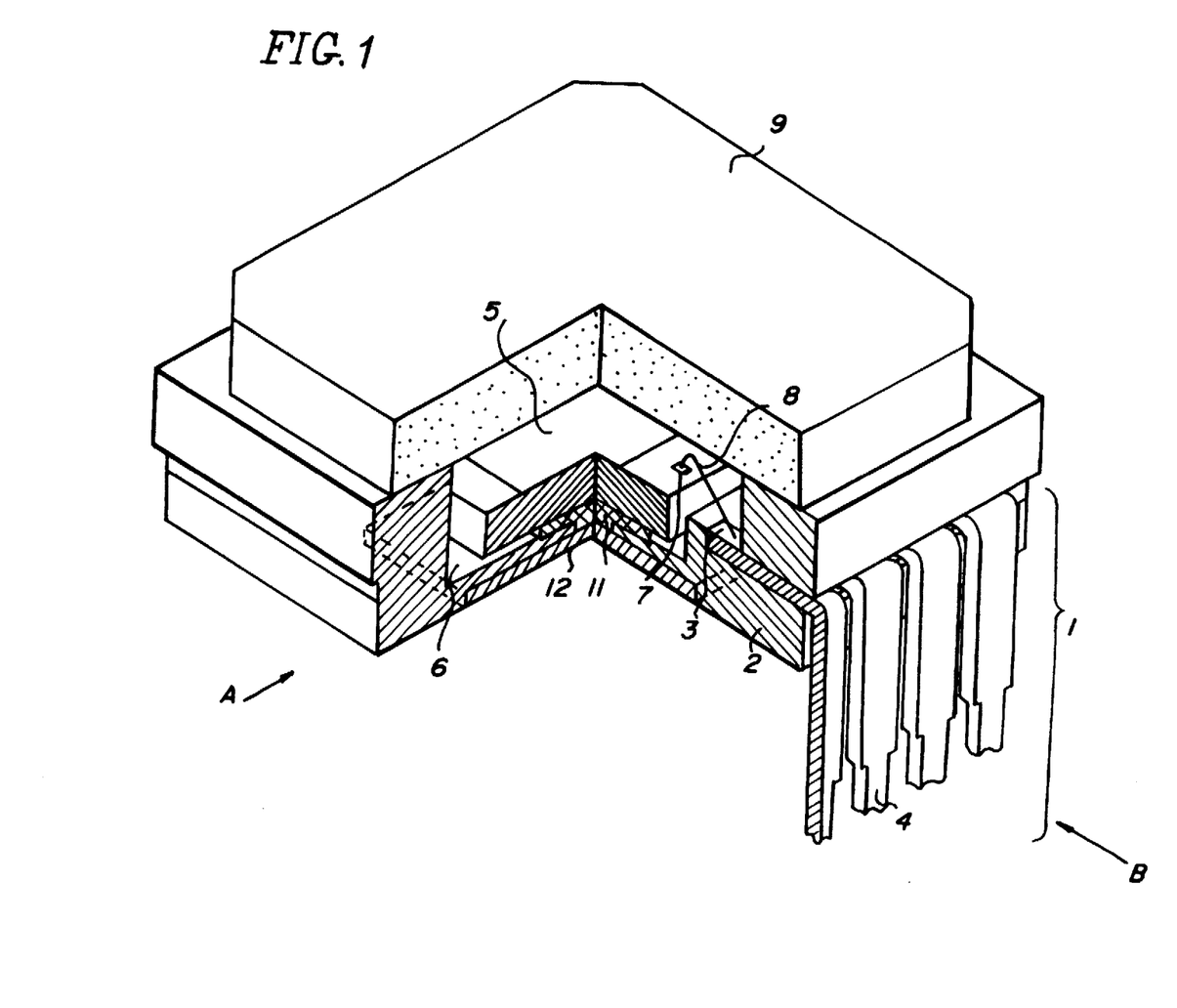
FIG. 1 is a partially cutaway perspective view of a semiconductor apparatus in a first example of the present invention.

The semiconductor apparatus shown in FIG. 1 includes: a lead frame 1; a moldable resin 2; a semiconductor device 5; a wire 8; a lid 9; a radiator member 11; and an island 12. The lead frame 1 includes a plurality of leads and the island 12, each of the leads including an inner lead 3 and an outer lead 4. The lead frame 1 is preferably made of a metal such as 42 alloy. The semiconductor device 5 includes a plurality of aluminum electrodes, each of which is electrically connected with a part of the inner lead 3 through the wire 8. The wire 8 is preferably an aluminum wire or a gold wire. In the case where the semiconductor device 5 is a solid-state imaging device such as a charge coupled device, the lid 9 can be made of a flat-plate shaped transparent material. In such a case, the lid 9 is preferably made of glass.

Figure 2A:
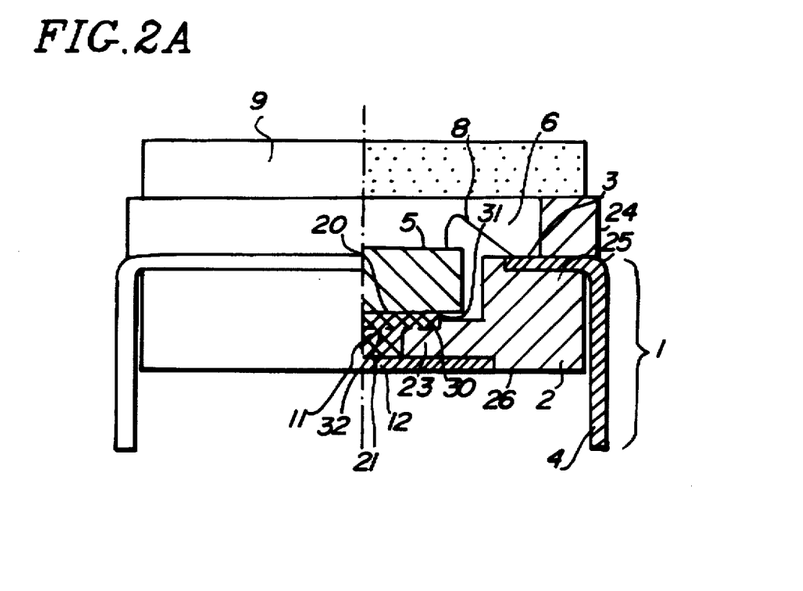
Figure 2B:
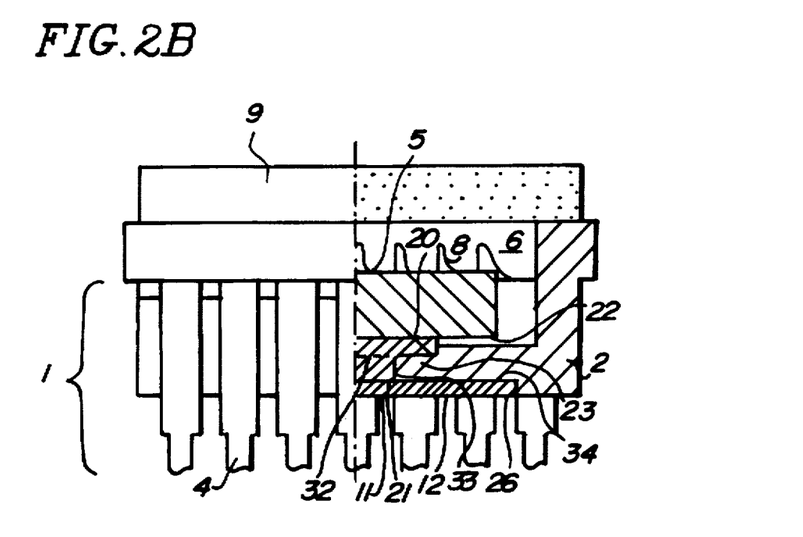
FIG. 2B is a sectional side elevation, seen from the direction B, of the semiconductor apparatus shown in FIG. 1.

As shown in FIGS. 2A and 2B, the radiator member 11 has an upper surface 20 and a lower surface 21 which are opposed to each other. It is preferable for the upper surface 20 and the lower surface 21 to be parallel to each other. The area of the upper surface 20 is larger than that of the lower surface 21. Also, the area of the upper surface 20 of the radiator member 11 is smaller than that of the lower surface 22 of the semiconductor device 5. Accordingly, the semiconductor device 5 is unlikely to be affected by the unevenness of the upper surface 20 of the radiator member 11 on which the semiconductor device 5 is mounted.

The radiator member 11 can be in contact with the island 12 at a plurality of regions.

The arrangement of the respective components of the semiconductor apparatus shown in FIG. 1 will be described with reference to FIGS. 2A and 2B. FIG. 2A is a sectional side elevation, seen from the direction A, of the semiconductor apparatus shown in FIG. 1, while FIG. 2B is a sectional side elevation, seen from the direction B, of the semiconductor apparatus shown in FIG. 1.

Figure 3A:
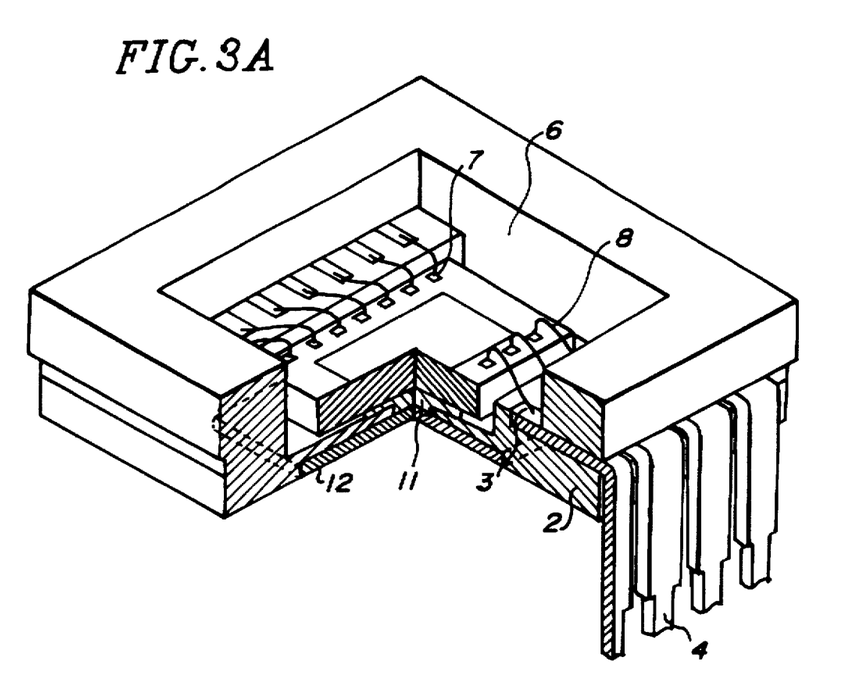
Figure 3B:
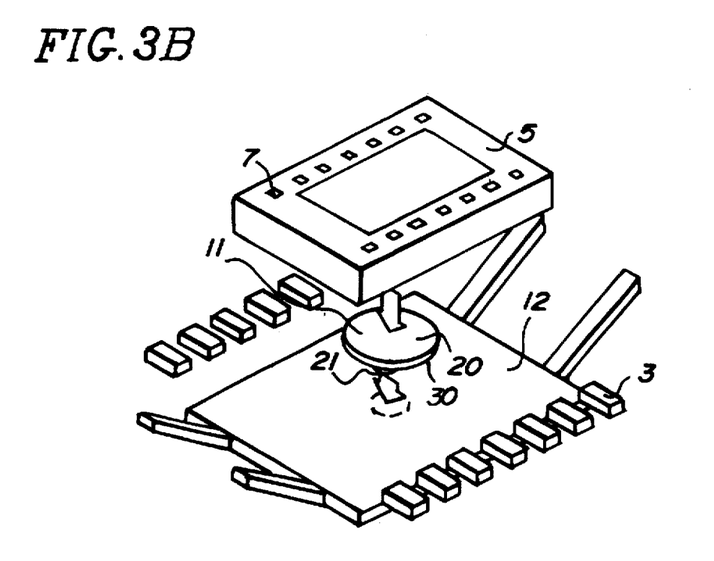
FIG. 3B is an exploded view of the semiconductor apparatus shown in FIG. 3A for illustrating parts of the semiconductor apparatus shown in FIG. 3A.

The semiconductor device 5 is die-bonded to the upper surface 20 of the radiator member 11 via a silver paste or the like. The radiator member 11 is connected to the island 12 via an adhesive having a satisfactory thermal conductivity. Alternatively, the radiator member 11 can be welded to the island 12. The radiator member 11 can include a plate portion having an upper surface 20, a lower surface 30 and side surface(s) 31 and a body portion having an upper surface 32, a lower surface 21 and side surface(s) 33. As shown in FIG. 3B, the plate portion has a side surface 31 in a cylindrical shape. However, the plate portion can have at least two side surfaces 31. For example, the transverse cross section of the plate portion can be rectangular, semicircular or in a donut shape. In the same way, though the body portion has a side surface 33 in a cylindrical shape in FIG. 3B, the body portion can have at least two side surfaces 33. For example, the transverse cross section of the body portion can be rectangular, semicircular or in a donut shape. Since the area of the lower surface 30 of the plate portion is larger than the area of the upper surface 32 of the body portion, and the area of the lower surface 21 of the body portion is smaller than the area of the upper surface 34 of the island 12, a space 23 is defined between the lower surface 30 of the plate portion and the upper surface 34 of the island 12. The upper surface 20 of the plate portion can be parallel to the lower surface 21 of the body portion. The upper surface 20 of the plate portion is preferably parallel to the lower surface 26 of the island.

The inner lead 3 is fixed by molding the moldable resin 2. A hollow portion 6 is formed between the moldable resin 2 and the lid 9. The space 23 between the lower surface 30 of the plate portion of the radiator member 11 and the upper surface 34 of the island 12 is filled with the moldable resin 2. Therefore, even when water permeate from the gap between the island 12 and the moldable resin 2, the permeated water is unlikely to reach the hollow portion 6 between the moldable resin 2 and the lid 9, so that the lid 9 is unlikely to be clouded by water.

Hereinafter, a method for fabricating the semiconductor apparatus shown in FIG. 1 will be described.

The lead frame 1 is formed by etching or pressing a metallic material such as 42 alloy so as to have a predetermined pattern. The island 12 is a part of the lead frame 1. As shown in FIGS. 2A and 3A, the island 12 is located below the inner lead 3 of the lead frame 1.

The radiator member 11 can be made of a metallic material. The area of the upper surface 20 of the radiator member 11 is smaller than that of the lower surface 22 of the semiconductor device 5. The lower surface 21 opposed to the upper surface 20 of the radiator member 11 can have at least one protruding portion (not shown).

FIG. 3A is a partially cutaway perspective view of the semiconductor apparatus in which a semiconductor device of the first example is mounted on a hollow package having a radiator member; while FIG. 3B is an exploded view of the semiconductor apparatus shown in FIG. 3A for illustrating parts of the semiconductor apparatus shown in FIG. 3A. As shown in FIG. 3B, the lower surface 21 having the protruding portion(s) of the radiator member 11 is welded to the island 12 or bonded to the island 12 via an adhesive having a satisfactory thermal conductivity. Therefore, it is possible to mount the semiconductor device 5 so as to be parallel to the island 12 during a subsequent process step.

The lead frame 1 is sandwiched between an upper mold and a lower mold (neither is shown) formed so as to secure a hollow portion 6 required for mounting the semiconductor device 5 therein.

At this stage, the upper surface 20 of the radiator member 11 on which the semiconductor device 5 is mounted comes into contact with the upper mold, and the lower surface 26 of the island 12 comes into contact with the lower mold. The upper mold is used for molding an upper portion 24 over the inner lead 3, while the lower mold is used for molding a lower portion 25 under the inner lead 3. The upper mold and the lower mold form a pair and sandwich the radiator member 11 and the island 12 therebetween.

Thereafter, a moldable resin 2 such as a thermosetting epoxy resin is transfer molded in the upper and the lower molds, thereby molding a hollow plastic package having a radiator system. Since the radiator member 11 and the island 12 are pressed by the upper and lower molds, the positions of the radiator member 11 and the island 12 are not changed during filling with the moldable resin 2.

When the moldable resin 2 has been molded, the upper surface 20 of the radiator member 11 is exposed through the hollow portion 6, while the lower surface 26 of the island 12 is exposed through the reverse side of the package.

After the hollow plastic package has been molded, the outer lead 4 is bent into a predetermined shape. The inner lead 3 and the outer lead 4 can be plated with gold or the like beforehand. The semiconductor device 5 is die-bonded to the upper surface 20 of the radiator member 11 via a silver paste or the like. As a result, the semiconductor apparatus can radiate the heat generated by the semiconductor device 5 during the operation thereof through the radiator member 11, the island 12, and into the air.

In the case where the area of the upper surface 20 of the radiator member 11 is smaller than that of the bottom surface of the semiconductor device 5, the semiconductor device 5 is less likely to be affected by the unevenness of the upper surface 20 of the radiator member 11, as compared with the case where the bottom surface of the semiconductor device is entirely in contact with the upper surface 20 of the radiator member 11. Therefore, the semiconductor device 5 can be kept parallel to the reverse side of the package. Accordingly, in the case where the semiconductor device 5 is a solid-state imaging device such as a charge coupled device, the gate of the solid-state imaging device can be defined with high precision.

As shown in FIG. 3A, the aluminum electrode 7 of the die-bonded semiconductor device 5 is wire-bonded to a part of the inner lead 3 through a fine aluminum wire or a fine gold wire 8, so as to be electrically connected with the inner lead. 3.

The lid 9 made of a flat plate shaped transparent material such as glass covers the opening of the hollow plastic package with an adhesive made of a thermosetting epoxy resin or the like.

EXAMPLE 2

Hereinafter, a semiconductor apparatus of a second example of the present invention will be described.

Figure 4:
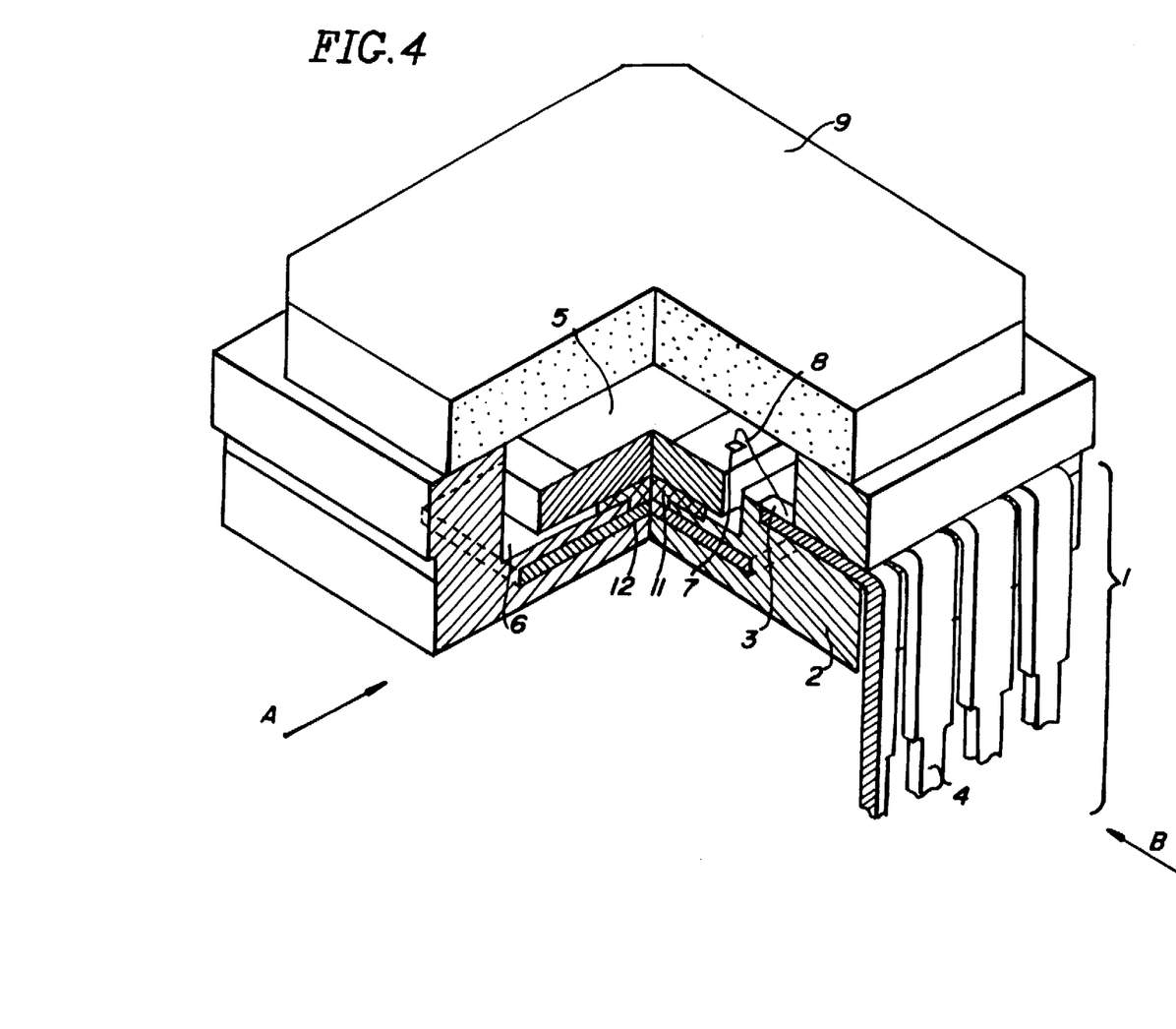
FIG. 4 is a partially cutaway perspective view of a semiconductor apparatus in a second example of the present invention.

The semiconductor apparatus shown in FIG. 4 includes: a lead frame 1; a moldable resin 2; a semiconductor device 5; a wire 8; a lid 9; a radiator member 11; and an island 12. The lead frame 1 includes a plurality of leads and the island 12, each of the leads including an inner lead 3 and an outer lead 4. The lead frame 1 is preferably made of a metal such as 42 alloy. The semiconductor device 5 includes a plurality of aluminum electrodes, each of which is electrically connected with a part of the inner lead 3 through the wire 8. The wire 8 is preferably an aluminum wire or a gold wire. In the case where the semiconductor device 5 is a solid-state imaging device, the lid 9 can be made of a flat-plate shaped transparent material. In such a case, the lid 9 is preferably made of glass.

The radiator member 11 has an upper surface 20 and a lower surface 21 opposed to each other. It is preferable for the upper surface 20 and the lower surface 21 to be parallel to each other. The area of the upper surface 20 is larger than that of the lower surface 21. Also, the area of the upper surface 20 of the radiator member 11 is smaller than that of the lower surface 22 of the semiconductor device 5. Accordingly, the semiconductor device 5 is unlikely to be affected by the unevenness of the upper surface 20 of the radiator member 11 on which the semiconductor device 5 is mounted. The radiator member 11 can be in contact with the island 12 at a plurality of parts.

Figure 5A:
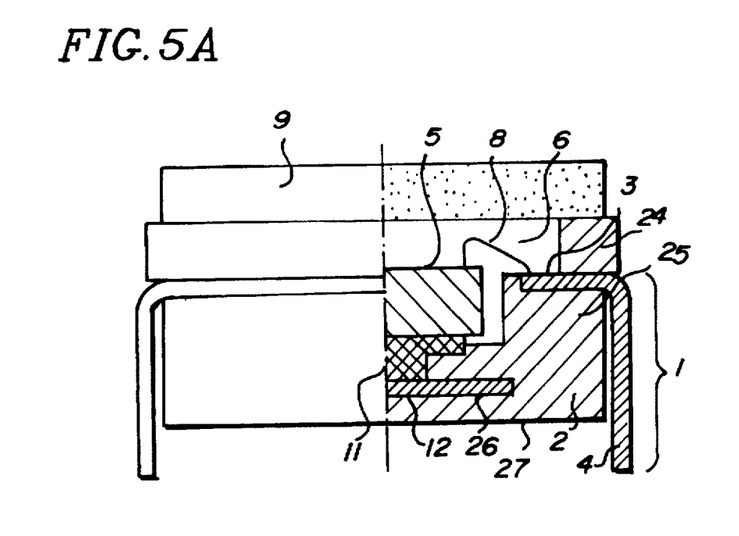
Figure 5B:
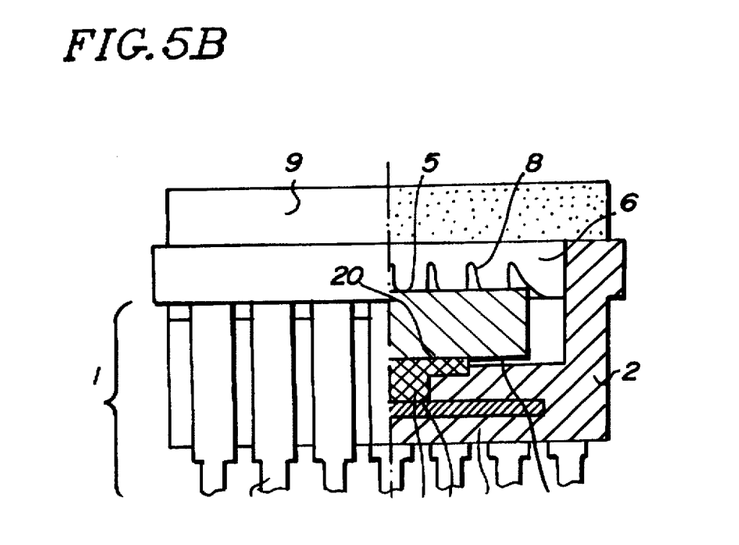
FIG. 5B is a sectional side elevation, seen from the direction B, of the semiconductor apparatus shown in FIG. 4.

As shown in FIGS. 5A and 5B, the lower surface 26 of the island 12 is covered with the moldable resin. Therefore, water does not permeate from the interface between the island 12 and the moldable resin 2. The arrangement of the respective components in the semiconductor apparatus shown in FIG. 4 is different from that of the semiconductor apparatus shown in FIG. 1 in that the lower surface 26 of the island 12 is covered with the moldable resin.

The semiconductor apparatus shown in FIG. 4 can attain a radiation effect substantially equal to that attained by the semiconductor apparatus shown in FIG. 1. In addition, the semiconductor apparatus shown in FIG. 4 has a moisture resistance substantially equal to that of the semiconductor apparatus shown in FIG. 1.

Hereinafter, a method for fabricating the semiconductor apparatus shown in FIG. 4 will be described with reference to FIGS. 5A and 5B.

The lead frame 1 is formed by etching or pressing a metallic material such as 42 alloy so as to have a predetermined pattern. The island 12 is a part of the lead frame 1. As shown in FIGS. 4 and 5A, the island 12 is located below the inner lead 3 of the lead frame 1.

The radiator member 11 can be made of a metallic material. The area of the upper surface 20 of the radiator member 11 is smaller than that of the lower surface 22 of the semiconductor device 5. The lower surface 21 opposed to the upper surface 20 of the radiator member 11 can have one or a plurality of protruding portion(s) (not shown).

The lower surface 21 of the radiator member 11 is welded to the island 12 or bonded to the island 12 via an adhesive having a satisfactory thermal conductivity.

The lead frame 1 is sandwiched between an upper mold and a lower mold (neither is shown) formed so as to secure a hollow portion 6 required for mounting the semiconductor device 5 therein. At this stage, the radiator member 11 on which the semiconductor device 5 is to be mounted is pressed by the upper mold, while the lower surface 26 of the island 12 is not in contact with the lower mold. As a result, the radiation system member 11 and the island 12 are fixed by the upper and the lower molds.

The upper mold is used for molding an upper portion 24 over the inner lead 3, while the lower mold is used for molding a lower portion 25 under the inner lead 3. The upper mold and the lower mold form a pair.

Thereafter, a moldable resin 2 such as a thermosetting epoxy resin is transfer-molded in the upper and the lower molds, thereby molding a hollow plastic package having a radiator system. Since the radiator member 11 is pressed by the upper mold and the predetermined portions of the lead frame as well as the island 12 are interposed between the upper and the lower molds, the positions of the radiator member 11 and the island 12, which are connected with each other, are not changed during filling with the moldable resin 2.

When the moldable resin 2 has been molded, the upper surface 20 of the radiator member 11 is exposed through the hollow portion 6, while the lower surface 26 of the island 12 is covered with the moldable resin.

Since the remaining process steps of the method for fabricating the semiconductor apparatus shown in FIG. 4 are the same as those of the method for fabricating the semiconductor apparatus shown in FIG. 1, the description thereof will be omitted herein.

When a CPU or the like sealed with a resin, etc. is operated at a high speed, the sealing resin has a parasitic capacitance. Even when a CPU is mounted as a semiconductor device 5 in the hollow plastic package so as to prevent the semiconductor device from having a parasitic capacitance, the heat generated by the CPU can be radiated into the air. If the semiconductor device 5 is a CPU, the semiconductor apparatus according to the present invention can attain a satisfactory radiation effect. In such a case, the lid 9 need not be made of a transparent material.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor apparatus comprising:
   a semiconductor chip having an upper surface, a lower surface and at least one side surface;
   a first radiator plate for radiating heat comprising a plate portion having an upper surface, a lower surface and at least one side surface and a body portion having an upper surface, a lower surface and at least one side surface, the upper surface of the body portion having an area smaller than an area of the lower surface of the plate portion and being connected with the lower surface of the plate portion;
   a second radiator plate for radiating heat comprising an upper surface, a lower surface and at least one side surface, the upper surface of the second radiator plate having an area larger than the lower surface of the body portion of the first radiator plate;
   a case body surrounding the lower surface and the side surface of the semiconductor chip; and
   a cover which is located above the upper surface of the semiconductor chip and is connected with the case body,
   wherein the lower surface of the semiconductor chip is connected with the upper surface of the plate portion of the first radiator plate;
   and wherein the lower surface of the body portion of the first radiator plate is connected with the upper surface of the second radiator plate so as to define a space between the lower surface of the plate portion of the first radiator plate and the upper surface of the second radiator plate;
   and wherein a part of the case body is located between the lower surface of the plate portion of the first radiator plate and the upper surface of the second radiator plate so as to fill the space defined between the lower surface of the plate portion of the first radiator plate and the upper surface of the second radiator plate.

2. A semiconductor apparatus according to claim 1, wherein the case body further surrounds the second radiator plate.

3. A semiconductor apparatus according to claim 1, wherein the area of the lower surface of the semiconductor chip is larger than that of the upper surface of the plate portion of the first radiator plate, and wherein the area of the upper surface of the plate portion of the first radiator plate is larger than that of the lower surface of the body portion of the first radiator plate.

4. A semiconductor apparatus according to claim 1, wherein the upper surface of the plate portion of the first radiator plate is substantially parallel to the lower surface of the body portion of the first radiator plate.

5. A semiconductor apparatus according to claim 1, wherein the upper surface of the plate portion of the first radiator plate is substantially parallel to the lower surface of the second radiator plate.

6. A semiconductor apparatus according to claim 1, wherein the semiconductor chip is not in contact with the case body.

7. A semiconductor apparatus according to claim 1, wherein the semiconductor chip is a solid-state imaging device.

8. A semiconductor apparatus according to claim 1, wherein the cover is a transparent member.

9. A semiconductor apparatus according to claim 1, wherein the case body is made of a resin.

10. A semiconductor apparatus according to claim 1, further comprising a plurality of terminals, each of which is formed of a lead frame,
    wherein the second radiator plate is an island formed of the lead frame.

11. A semiconductor apparatus according to claim 1, wherein a number of side surfaces of the semiconductor chip, the first radiator plate plate portion and body portion, and the second radiator plate is a function of a shape of the semiconductor chip, the first radiator plate plate portion and body portion, and the second radiator plate, respectively.

12. A semiconductor apparatus according to claim 11, wherein a shape of the first radiator plate plate portion is rounded and wherein a shape of the first radiator plate body portion is rounded.

13. A semiconductor apparatus comprising:
    a semiconductor chip having an upper surface, a lower surface and at least one side surface;
    a first radiator plate for radiating heat comprising a plate portion having an upper surface, a lower surface and at least one side surface and a body portion having an upper surface, a lower surface and at least one side surface, the upper surface of the body portion having an area smaller than an area of the lower surface of the plate portion, the lower surface of the semiconductor chip being connected with the upper surface of the first radiator plate plate portion;
    a second radiator plate for radiating heat comprising an upper surface, a lower surface and at least one side surface, the upper surface of the second radiator plate having an area larger than the lower surface of the first radiator plate body portion, the lower surface of the first radiator plate body portion being connected with the upper surface of the second radiator plate defining a space between the lower surface of the first radiator plate plate portion and the upper surface of the second radiator plate; and
    a case body surrounding the lower surface and the side surface of the semiconductor chip and the side surface of the second radiator plate.

14. A semiconductor apparatus according to claim 13, wherein the case body further surrounds the second radiator plate.

15. A semiconductor apparatus according to claim 13, wherein the lower surface of the second radiator plate is not surrounded by the case body.

16. A semiconductor apparatus according to claim 13, wherein a part of the case body is disposed in the space between the lower surface of the first radiator plate plate portion and the upper surface of the second radiator plate.

17. A semiconductor apparatus according to claim 13, wherein the semiconductor chip is not in contact with the case body.

18. A semiconductor apparatus according to claim 13, wherein the semiconductor chip is a solid-state imaging device.

19. A semiconductor apparatus according to claim 13, wherein the case body is made of a resin.

20. A semiconductor apparatus according to claim 13, further comprising a plurality of terminals, each of which is formed of a lead frame, wherein the second radiator plate is an island formed of the lead frame.

* * * * *

UNITED STATES PATENT AND TRADEMARK OFFICE
CERTIFICATE OF CORRECTION

PATENT NO. : 5,757,075
DATED : May 26, 1998
INVENTOR(S) : KITAOKA

It is certified that error appears in the above-identified patent and that said Letters Patent is hereby corrected as shown below:

```
In the drawings:
    Delete Fig. 5B from drawing sheet 5, and substitute therefor
    the Fig. 5B, as shown on the attached page.
```

Signed and Sealed this

Fifteenth Day of September, 1998

Attest:

BRUCE LEHMAN

*Attesting Officer*     Commissioner of Patents and Trademarks

FIG. 5B